(12) United States Patent
Iijima et al.

(10) Patent No.: US 7,335,531 B2
(45) Date of Patent: Feb. 26, 2008

(54) SEMICONDUCTOR DEVICE PACKAGE AND METHOD OF PRODUCTION AND SEMICONDUCTOR DEVICE OF SAME

(75) Inventors: Takahiro Iijima, Nagano (JP); Akio Rokugawa, Nagano (JP)

(73) Assignee: Shinko Electric Industries, Co;, Ltd., Nagano (JP)

( * ) Notice: Subject to any disclaimer, the term of this patent is extended or adjusted under 35 U.S.C. 154(b) by 345 days.

(21) Appl. No.: 11/130,845

(22) Filed: May 17, 2005

(65) Prior Publication Data
US 2005/0208705 A1 Sep. 22, 2005

Related U.S. Application Data

(62) Division of application No. 10/315,468, filed on Dec. 10, 2002, now Pat. No. 6,914,322.

(30) Foreign Application Priority Data
Dec. 26, 2001 (JP) .............................. 2001-394694

(51) Int. Cl.
*H01L 21/44* (2006.01)
(52) U.S. Cl. ..................... 438/106; 438/393; 361/766
(58) Field of Classification Search ........ 438/106–108, 438/393, 396, 800; 361/766
See application file for complete search history.

(56) References Cited

U.S. PATENT DOCUMENTS 6,108,212 A * 8/2000 Lach et al. ................. 361/768
6,370,013 B1 * 4/2002 Iino et al. ................. 361/306.3
6,764,931 B2 * 7/2004 Iijima et al. ................. 438/584
7,176,556 B2 * 2/2007 Okamoto et al. ........... 257/621
2002/0185303 A1 * 12/2002 Takeuchi et al. ............ 174/256

FOREIGN PATENT DOCUMENTS

JP    A-2000-349225    12/2000
JP    A-2001-274034    10/2001

* cited by examiner

Primary Examiner—Tuan H. Nguyen
(74) Attorney, Agent, or Firm—Paul & Paul

(57) ABSTRACT

A semiconductor device including a semiconductor device package providing a capacitor in its circuit board and a semiconductor chip mounted on that package, wherein the capacitor is provided directly under a semiconductor chip mounting surface of the circuit board on which the semiconductor chip is to be mounted and the conductor circuit electrically connecting the semiconductor chip and capacitor is made the shortest distance by having the external connection terminals of the capacitor directly connected to the other surface of the connection pads exposed at one surface at the semiconductor chip mounting surface of the circuit board and to which the electrode terminals of the semiconductor chip are to be directly connected.

10 Claims, 9 Drawing Sheets

- Related Art -

US 7,335,531 B2

SEMICONDUCTOR DEVICE PACKAGE AND METHOD OF PRODUCTION AND SEMICONDUCTOR DEVICE OF SAME

CROSS-REFERENCE TO RELATED APPLICATIONS

This application is a divisional of U.S. application Ser. No. 10/315,468, filed Dec. 10, 2002 now U.S. Pat. No. 6,914,322, the entire specification of which is herein incorporated by reference.

BACKGROUND OF THE INVENTION

1. Field of the Invention

The present invention relates to a semiconductor device package and a method of production and semiconductor device of the same, more particularly relates to a semiconductor device package providing a capacitor in a circuit board on which a semiconductor chip is mounted and a method of production and semiconductor device of the same.

2. Description of the Related Art

In recent years, semiconductor devices have been mounting higher operating frequency semiconductor chips. Along with this, it is becoming necessary to stabilize the power supplied to the semiconductor chips. Therefore, chip capacitors or other capacitors are being provided in the semiconductor device packages mounting the semiconductor chips.

One of the inventors of this application previously proposed the semiconductor device shown in FIG. 10 in the specification of Japanese Patent Application No. 2000-276514 as a semiconductor device using a semiconductor device package provided internally with a chip capacitor or other capacitor.

The semiconductor device 100 shown in FIG. 10 is comprised of a multilayer circuit board, that is, a semiconductor device package 104 (hereinafter referred to simply as "the package 104") and a semiconductor chip 102 mounted on the same. The semiconductor device package 104 is formed with multiple layers of conductor patterns 108, 108 . . . on the two surfaces of a plate-shaped core material 106 comprised of a glass epoxy board etc. The conductor patterns 108, 108 . . . are formed in multiple layers. The conductor patterns 108, 108 . . . formed in the multiple layers are electrically connected by through holes 110, 110 passing through the core material 106 and vias 112, 112, etc. passing through insulating layers 114, 114 . . . .

The package 104 has a capacitor 118 inserted into a recess 116 formed by a router etc. in the core material 106. The capacitor 118 is comprised of a silicon substrate 118a, a film 118b comprised of a dielectric material formed on one surface of the same, and a conductive film 118c formed on the surface of that film.

The capacitor 118 is bonded by a conductor binder 122 on to a metal plating film 120 formed along the inside wall of the recess 116.

Summarizing the problem to be solved by the invention, according to the semiconductor device shown in FIG. 10, it is possible to provide the capacitor at the inside of the package 104 near the mounted semiconductor chip 102 and therefore possible to stabilize the power supplied to the semiconductor chip 102 etc. Therefore, even if mounting a high operating frequency semiconductor chip 102, erroneous operation due to unstable power etc. can be prevented.

Even with the semiconductor device shown in FIG. 10, however, it was known that still further stabilization of the power etc. supplied to the semiconductor chip is required for carrying a further higher speed (higher frequency) semiconductor chip.

The inventors studied the reasons why the power supplied to a semiconductor chip 102 cannot be stabilized when mounting a further higher speed (higher frequency) semiconductor chip in the semiconductor device shown in FIG. 10.

In the semiconductor device 100, the capacitor 118 is inserted into the recess 116 formed in the core 106 formed at the substantial center of the package 104. The conductor circuit extending from the electrode terminals of the mounted semiconductor chip 102 to the capacitor 118 is formed bent.

Therefore, the conductor circuit extending from the electrode terminals of the semiconductor chip 102 to the capacitor 118 is long and has many connection locations, and the inductance of the conductor circuit extending from the external connection terminals of the semiconductor device 100 to the semiconductor chip 102 becomes large. Due to this, it was learned that the power supplied to the semiconductor chip 102 easily became unstable.

SUMMARY OF THE INVENTION

An object of the present invention is to provide a semiconductor device package able to shorten as much as possible the conductor circuit extending from the electrode terminals of the mounted semiconductor chip to the capacitor and a method of production and semiconductor device for the same.

The inventors engaged in studies to achieve this object believing it effective to provide a capacitor 118 in a package 104 so as to directly connect external connection terminals of the capacitor 118 to connection pads to be connected with electrode terminals of the semiconductor chip 102 formed on the surface of the package 104 for mounting the semiconductor chip 102 and as a result perfected the present invention.

According to a first aspect of the present invention, there is provided a semiconductor device package providing a capacitor in a circuit board for mounting a semiconductor chip, wherein the capacitor is provided directly beneath a semiconductor chip mounting surface of the circuit board to which the semiconductor chip is to be mounted, the semiconductor chip mounting surface of the circuit board is formed with connection pads exposed at one surface so that electrode terminals of the semiconductor chip may be directly connected, and the other surface of the connection pads to which the electrode terminals of the semiconductor chip are to be connected corresponding to the external connection terminals of the capacitor among the connection pads have the external connection terminals of the capacitor directly connected to them.

According to a second aspect of the present invention, there is provided a method of production of a semiconductor device package for producing a semiconductor device package providing a capacitor in a circuit board comprising directly connecting external connection terminals of the capacitor to one surface of capacitor connection terminals to which the capacitor is to be connected among the connection pads formed in a state with the other surface to which electrode terminals of the semiconductor chip to be mounted are to be directly connected in close contact with one surface of a metal plate, forming a circuit board provided with a conductor circuit electrically connecting the connection pads and external connection terminals of the capacitor at one surface of the metal plate, or mounting the capacitor so as to make one surface of the connection surfaces of the external connection terminals to which the electrode terminals of the semiconductor chip to be mounted are to be directly connected closely contact one surface of the metal plate, then forming a circuit board provided with a conductor circuit electrically connected with other external connection terminals of the capacitor at that surface of the metal plate, and etching the other surface of the metal plate to expose the semiconductor mounting surface of the circuit board including at least the connection pads or the connection surfaces of the external connection terminals of the capacitor to which the electrode terminals of the semiconductor chip are to be directly connected.

According to a third aspect of the present invention, there is provided a semiconductor device comprised of such a semiconductor device package and a semiconductor chip mounted on a semiconductor chip mounting surface of that package, wherein electrode terminals of the semiconductor chip are directly connected to one surface of connection pads to the other surface of which the external connection terminals of the capacitor provided at the semiconductor device package are directly connected or the connection surfaces of the external connection terminals of the capacitor provided in the semiconductor device package.

In the present invention, it is possible to use as the capacitor a two-sided wiring type capacitor comprised of a silicon substrate and external connection terminals formed at the two surfaces and thereby further shorten the length of the conductor circuit electrically connecting the electrode terminals of the semiconductor chip and external connection terminals of the package through the capacitor.

Preferably, to make the conductor circuit electrically connecting the capacitor connection pads formed on the semiconductor chip mounting surface on one surface of the circuit board and directly connected to the external connection terminals of the capacitor and the board external connection terminals formed at the other surface of the circuit board through the capacitor the shortest distance, it is preferable to form the board external connection terminals in directions of verticals descending from the capacitor connection pads to the other surface of the circuit board and form the conductor circuit substantially straight.

When forming the circuit board as a multilayer circuit board, by forming a conductor circuit electrically connecting the capacitor connection pads formed on the semiconductor chip mounting surface on one surface of the multilayer circuit board and the board external connection terminals formed at the other surface of the multilayer circuit board through the capacitor by stacking in straight lines the vias formed by filling metal into through holes passing through the layers, it is possible to make the conductor circuit electrically connecting with the board external connection terminals formed at the other surface of the circuit board through the capacitor the shortest distance possible.

In the semiconductor device package according to the present invention (hereinafter sometimes referred to simply as the "package"), when a semiconductor chip is mounted on the semiconductor chip mounting surface, the electrode terminals of the semiconductor chip corresponding to the external connection terminals of the capacitor are directly connected to one surface of connection pads to the other surface of which the external connection terminals of the capacitor are directly connected among the connection pads formed exposed at one surface at the semiconductor chip mounting circuit.

Alternatively, the electrode terminals of the semiconductor chip corresponding to the external connection terminals of the capacitor are directly connected to the connection surfaces of the external connection terminals of the capacitor exposed at the semiconductor chip mounting surface.

Therefore, since the electrode terminals of the semiconductor chip and the electrode terminals of the capacitor are connected through the connection pads or directly, it is possible to shorten the distance of the conductor circuit between terminals as much as possible and reduce the connection locations and possible to reduce the inductance of the conductor circuit electrically connecting the electrode terminals of the semiconductor chip and electrode terminals of the capacitor.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Preferred embodiments of the present invention will be described in detail below while referring to the attached figures.

Figure 1:
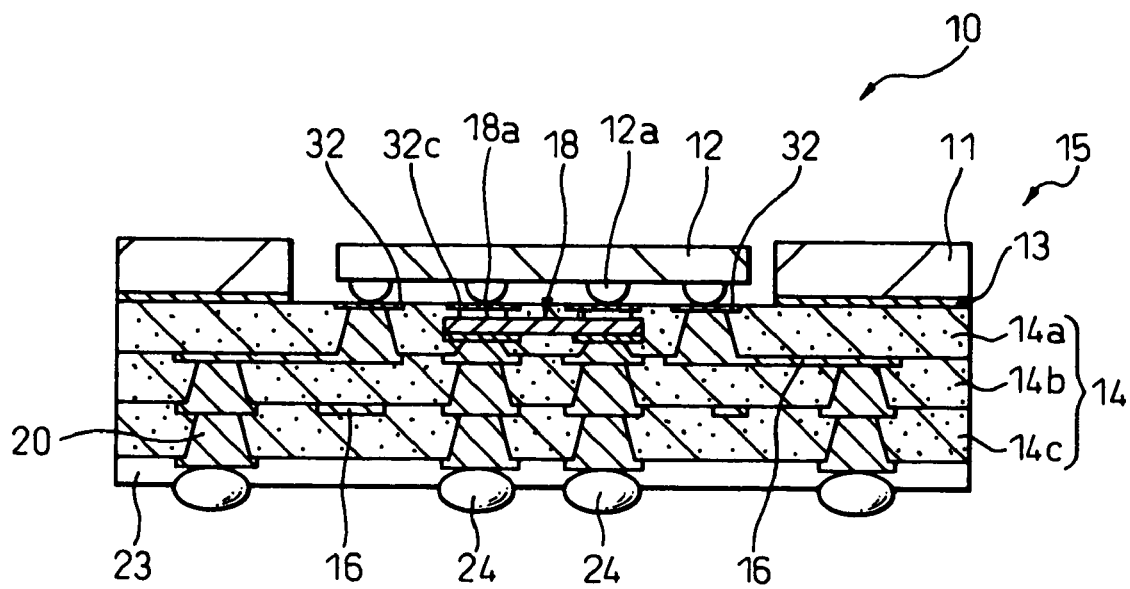
FIG. 1 is a sectional view for explaining an example of a semiconductor device according to the present invention.

A semiconductor device according to the present invention is shown in FIG. 1. The semiconductor device 10 shown in FIG. 1 is comprised of a semiconductor device package 14 (hereinafter sometimes simply referred to as a "package") provided inside it with a capacitor 18, a frame-shaped metal plate 11 serving as a reinforcing member bonded to one surface of the same by a thin resin layer 13, and a semiconductor chip 12 mounted by flip-chip bonding to a semiconductor chip mounting surface formed in a frame-shaped opening of the metal plate 11.

The package 14 is a multilayer circuit board comprised of a stack of resin layers 14a, 14b, and 14c serving as insulating layers formed with conductor patterns 16, 16 . . . . The conductor patterns 16, 16 . . . formed on the layers are electrically connected by vias 20, 20 . . . formed through the layers.

The other surface of the package 14 has solder balls attached to it serving as board external connector terminals. The solder balls 24, 24 . . . are electrically connected to electrode terminals of the semiconductor chip 12 by a conductor circuit comprised of the conductor patterns 16, vias 20, etc.

The other surface of the package 14 is covered by a solder resist 23 other than at the portions of the solder balls 24, 24 . . . .

Figure 2:
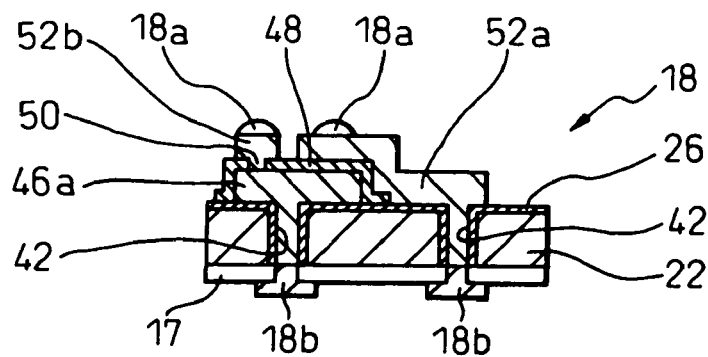
FIG. 2 is a sectional view for explaining an example of a capacitor provided at a semiconductor device package forming the semiconductor device shown in FIG. 1.

The capacitor 18 provided in the package 14, as shown in FIG. 2, is a two-sided wiring-type capacitor comprised of a silicon substrate 22 formed with external connection terminals 18a, 18a, 18b, 18b at the two surfaces.

The silicon substrate 22 is formed with through holes 42. One surface of the silicon substrate 22 and the inside walls of the through holes 42 are formed with an oxide film layer 26.

The oxide film layer 26 has formed on it a conductor pattern 46a and conductor pattern 52a adjoining each other via a dielectric layer 48 in a conductor circuit comprised of the conductor patterns 46a and 52b and a conductor circuit comprised of the conductor pattern 52a. At single ends of the conductor circuit comprised of the conductor patterns 46a and 52b and the conductor circuit comprised of the conductor pattern 52a are formed bump-shaped external connection terminals 18a, 18a.

Further, the other ends of the two conductor circuits are connected to external connection terminals 18b, 18b extending to the other surface of the silicon substrate 22 through vias formed by filling the through holes 42, 42 passing through the silicon substrate 22 with metal by plating etc. and formed with flat connection surfaces.

Figure 3:
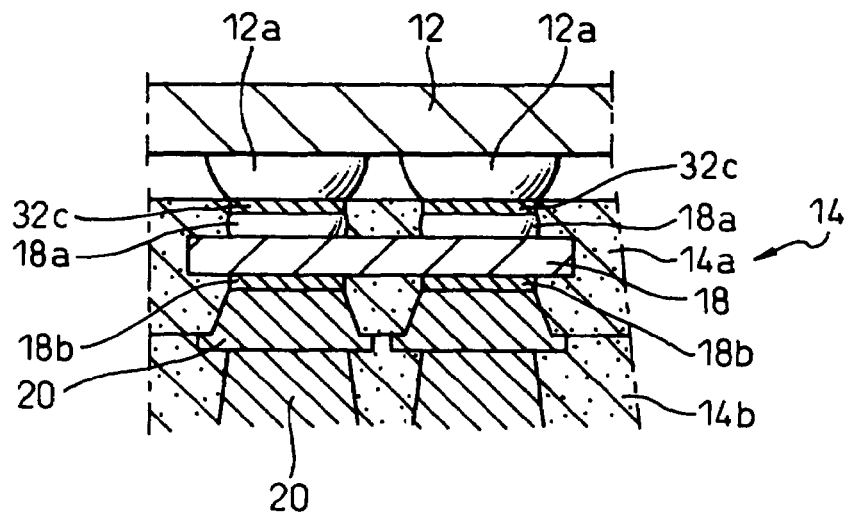
FIG. 3 is a partially enlarged sectional view of the semiconductor device shown in FIG. 1.

The bump-shaped external connection terminals 18a, 18a formed on one surface of the capacitor 18, as shown in FIG. 1 and FIG. 3, are directly connected to one surface of the capacitor connection pads 32c, 32c among the connection pads 32, 32 . . . formed on the semiconductor chip mounting surface of the package 14 and directly connected at the other surface to the electrode terminals of the semiconductor chip 12.

Figure 10:
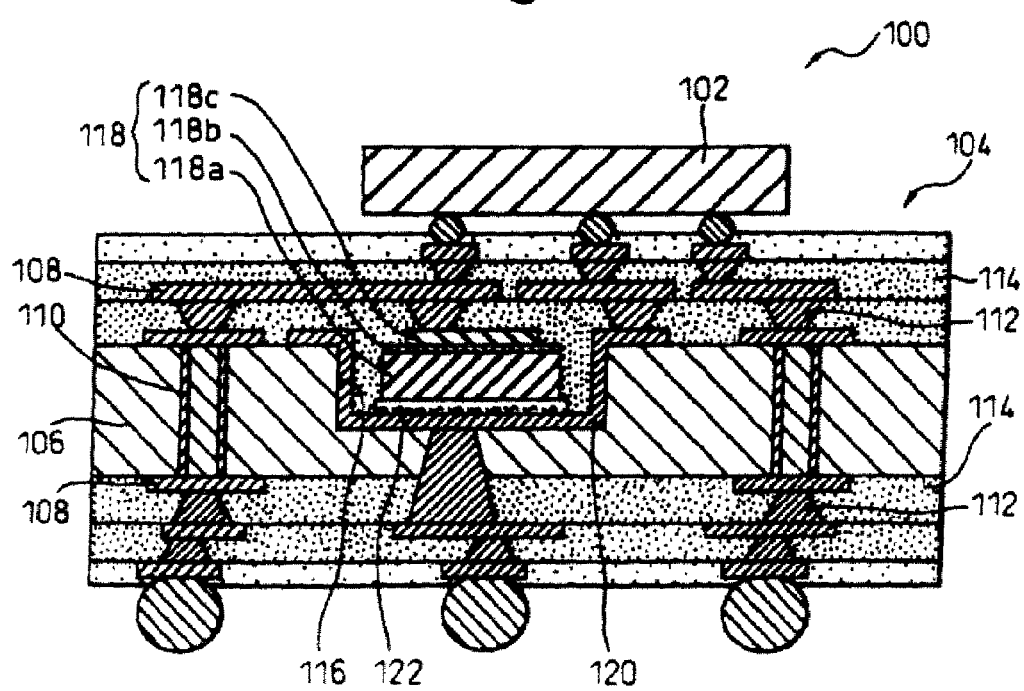
FIG. 10 is a sectional view for explaining a semiconductor device of the related art.

Therefore, the electrode terminals (solder bumps) 12a, 12a of the semiconductor chip 12 and the external connection terminals 18a, 18a formed on one surface of the capacitor 18 are connected through the connection pads 32c, 32c. Compared with a conductor circuit of the semiconductor device 100 shown in FIG. 10 where the electrode terminals of the semiconductor chip 102 and the capacitor 118 are electrically connected, the distance is shortened and the number of connection locations is smaller.

The external connection terminals 18b, 18b formed on the other surface of the capacitor 18 are electrically connected with the solder balls 24, 24 serving as the board external connection terminals attached to the other surface of the package 14 by the conductor circuit formed by the stack of vias 20, 20 . . . formed in the layers.

In the semiconductor device 10 shown in FIG. 1, the inductance of the conductor circuit can be further reduced by forming to the shortest distance the conductor circuit, formed by stacking of the vias 20, 20 . . . , electrically connecting the capacitor connection pads 32c, 32c and the solder balls 24, 24 through the capacitor 18.

Here, the "shortest distance" means the solder balls 24, 24 are formed in the direction of the verticals descending from the capacitor connection pads 32c, 32c to the other surface of the package 14 and the conductor circuit connecting the capacitor connector pads 32c, 32c and solder balls 24, 24 is formed substantially straight.

As in the semiconductor device 10 shown in FIG. 1, when the conductor circuit connecting the connection pads 32, 32 . . . and solder balls 24, 24 . . . is formed by stacking the vias 20, 20 . . . formed in the layers, making the vias 20, 20 . . . filled vias formed by filling through holes with copper or another metal makes it easier to flatten the end face of the formed vias 20 and makes it easier to stack the vias 20, 20 . . . straight.

The package 14 forming the semiconductor device 10 shown in FIG. 1 to FIG. 3 can be produced by the method shown in FIGS. 4A to 4K.

Figure 4A:
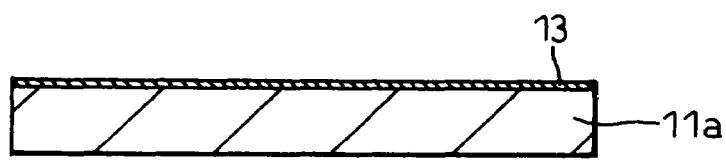
FIGS. 4A to 4K are sectional views for explaining steps of production of a semiconductor device package forming the semiconductor device shown in FIG. 1.

First, one surface of the metal plate 11a comprised of copper or another metal is coated with a polyimide or other resin to form a thin resin layer 13 (FIG. 4A).

Figure 4B:
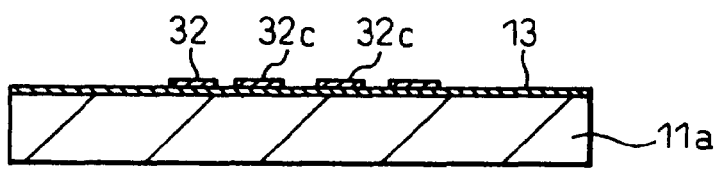

Further, the surface of the thin resin layer 13 is formed with a thin film metal layer of copper etc. by electroless plating etc. This thin film metal layer is used as a power feed layer to form a metal layer by electroplating. This metal layer is patterned by photolithography or another known method to form connection pads 32, 32 . . . (FIG. 4B). The connection pads 32, 32 . . . are formed in a state with one surface to which the electrode terminals of the semiconductor chip 12 are to be directly connected in close contact with the thin resin layer 13 formed on the metal plate 11a.

Figure 4C:
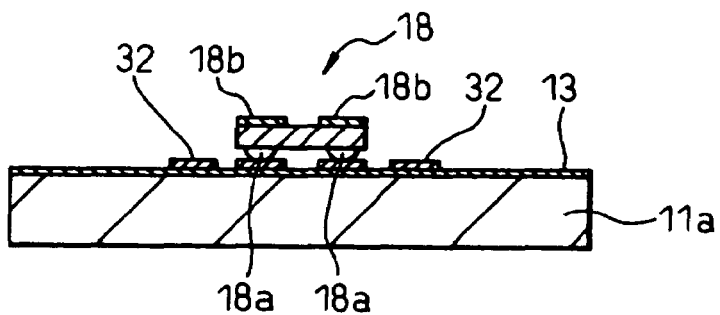

The other surfaces of the capacitor connection pads 32c, 32c among the connection pads 32, 32 . . . are joined with the external connection terminals 18a, 18a formed on one surface of the capacitor 18 using solder or another brazing material so as to mount the capacitor 18 (FIG. 4C).

Figure 4D:
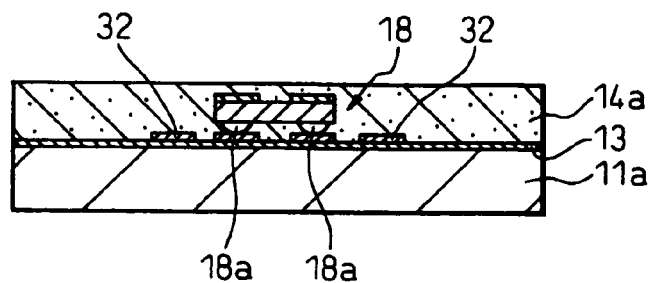

One surface of the metal plate 11a mounted with the capacitor 18 is laminated with a resin layer 14a so that the external connection terminals 18b, 18b formed on the other surface of the capacitor 18 are covered by resin (FIG. 4D). This resin layer 14a can be formed by coating a resin such as an epoxy, polyimide, or polyphenylene ether or stacking resin sheets comprised of these resins.

Figure 4E:
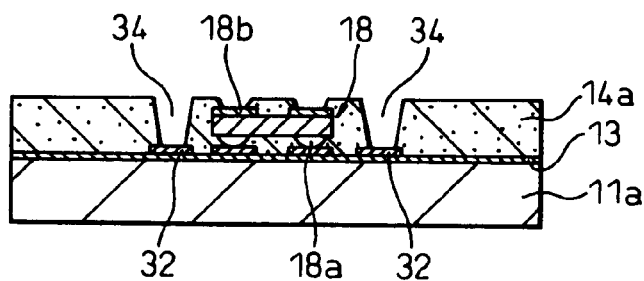

The resin layer 14a is formed with recesses 34, 34 . . . for forming vias by etching or a laser (FIG. 4E). At the bottoms of these recesses 34, 34 . . . , the connection pads 32 or external connection terminals 18b of the capacitor 18 are exposed.

Figure 4F:
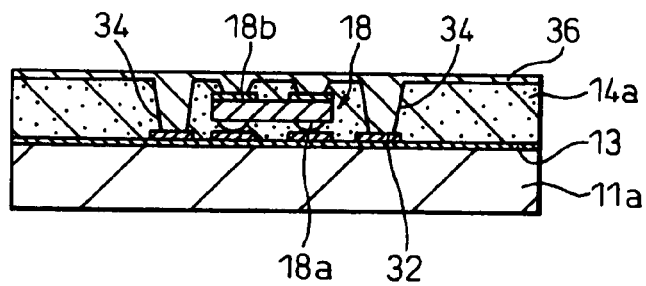

The entire surface of the resin layer 14a including the bottoms and inside walls of the recesses 34, 34 . . . is formed with a copper or other metal thin film formed by electroless plating etc. This is used as a power feed layer for electroplating to fill the recesses 34, 34 . . . by copper or another metal and form the metal layer 36 (FIG. 4F). As this electroplating, use of PR electroplating where the anode and cathode are reversed at a predetermined period is preferred.

In particular, it is preferable to invert the anode and cathode carrying the forward current for filling copper or another metal in the recesses 34, 34 . . . at a predetermined period to apply PR electroplating carrying reverse current in the opposite direction to the direction of flow of the forward current so as to form a metal film on the metal thin films in the recesses 34, 34 . . . , then electroplate the remaining portions of the recesses 34, 34 . . . by direct current to fill them with copper or another metal and form the vias 20, 20 . . . in that it is possible to sufficiently fill even small diameter recesses with a metal in a predetermined time to form vias.

After this electroplating is ended, the surface of the metal layer 36 may be polished to make the surface of the metal layer 36 flat.

Figure 4G:
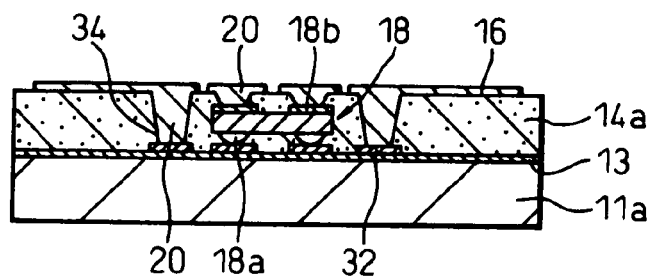

Next, the metal layer 36 is patterned by photolithography or another known method to form conductor patterns 16, 16 . . . (FIG. 4G).

Figure 4H:
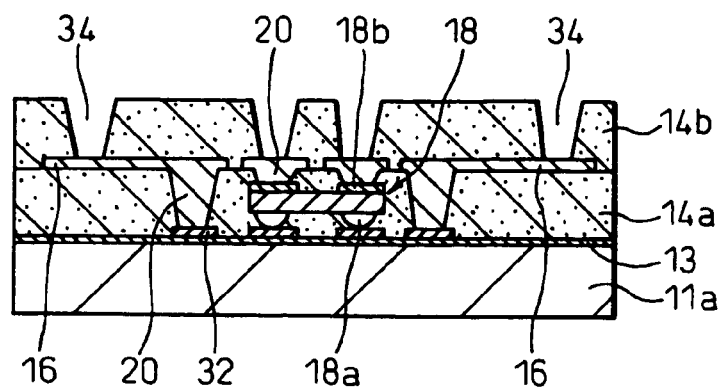
Figure 4I:
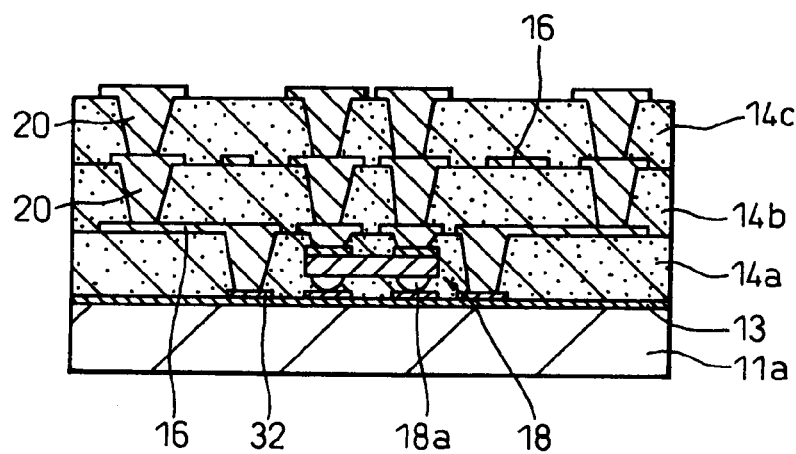

Further, the formed conductor patterns 16, 16 . . . are laminated with a resin layer 14b to cover them by a resin. The resin layer 14b formed is then formed with recesses 34, 34 . . . for forming vias by etching or laser. At the bottoms of the recesses 34, 34 . . . are exposed the conductor pattern 16 and vias 20 (FIG. 4H).

In this way, the recesses 34, 34 . . . formed in the resin layer 14b are formed with vias 20 and the conductor pattern 16 in the same way as with the step of FIG. 4F.

Figure 4J:
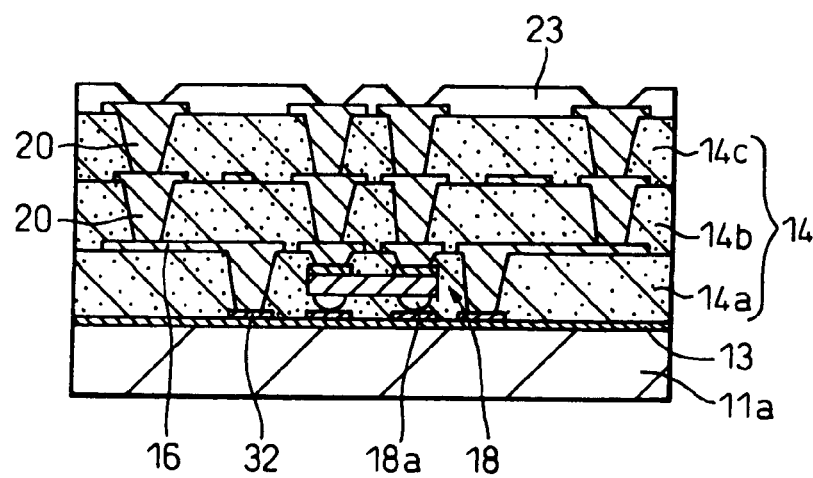

Similarly, the resin layer 14c formed so as to cover the conductor pattern 16 etc. formed at the resin layer 14b is also formed with vias 20 etc. (FIG. 4I), then the surface of the resin layer 14c is coated with a solder resist 23 other than at the pad portions where the solder balls 24 serving as the board external connection terminals are to be attached (FIG. 4J).

Next, the metal plate 11a is etched so as to expose the semiconductor chip mounting surface including the surfaces of the connection pads 32, 32 . . . to be connected to the electrode terminals 12a, 12a . . . of the semiconductor chip 12. The metal plate 11a may be etched to remove all of the metal plate 11a, but it is preferable to expose only the semiconductor chip mounting surface where the semiconductor chip 12 is to be mounted by etching away only the part covering the semiconductor chip mounting surface of the metal plate 11a and forming a package 14 reinforced by a frame-shaped metal plate 11 shown in FIG. 4K.

When etching the metal plate 11a, the thin resin layer 13 between the metal plate 11a and the resin layer 14a is normally not etched by the etching solution etching the metal plate 11a. When the portion covering the semiconductor chip mounting surface of the metal plate 11a finishes being etched, the etching proceeds no further. Therefore, over etching where the surface of the connection pads 32 is etched is prevented.

Further, if forming a thin resin layer 13 comprised of a resin of a different color from the metal plate 11a, when the portion of the metal plate 11a to be etched finishes being etched, the color of that portion will change and therefore it will be possible to directly judge that the etching had finished.

In this way, after the metal plate 11a finishes being etched in a predetermined manner, the exposed portion of the thin resin layer 13 is etched by an etching solution for etching the thin resin layer 13 without etching the metal plate 11a and the surfaces of the connection pads 32, 32 . . . are exposed.

Figure 4K:
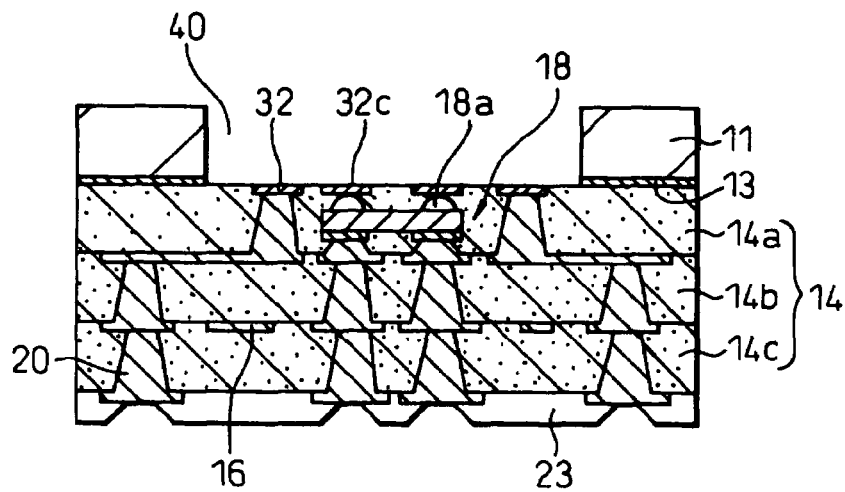

To obtain the semiconductor device 10 shown in FIG. 1 comprised of the package 14 shown in FIG. 4K mounting the semiconductor chip 12, it is possible to place the solder balls on the pads formed on the surface of the resin layer 14c, then make them reflow to attach the solder balls 24 serving as board external connection terminals.

Next, the semiconductor chip 12 is mounted on the semiconductor chip mounting surface of the resin layer 14a exposed at the opening of the metal plate 11 formed into the frame shape. At this time, the electrode terminals (solder bumps) 12a, 12a . . . of the semiconductor chip 12 are brought into contact with surfaces of the corresponding connection pads 32 and joined with them by reflowing so as to form the semiconductor device 10 shown in FIG. 1.

In the semiconductor device 10 shown in FIG. 1, by using one of the electrode terminals for power and the other of the electrode terminals for grounding among the electrode terminals 12a, 12a of the semiconductor chip 12 connected with the external connection terminals 18a, 18b of the capacitor 18 through the capacitor connection pads 32c, 32c, it is possible to stabilize the power supplied to the semiconductor chip 12 etc. Therefore, even if mounting a semiconductor chip 12 increased in operating frequency, erroneous operation due to instability of the power etc. can be prevented.

Figure 7:
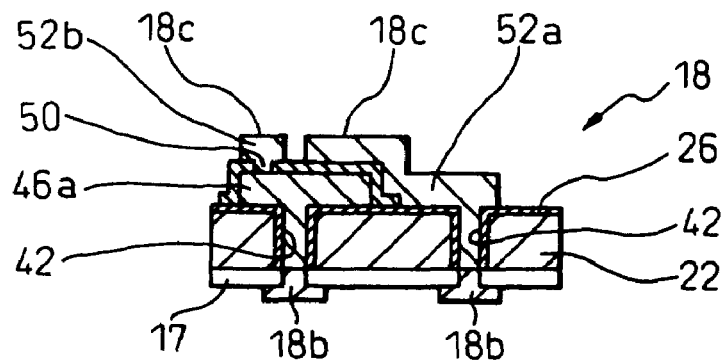
FIG. 7 is a sectional view for explaining another example of a capacitor provided at a semiconductor device package forming the semiconductor device shown in FIG. 6.

It is possible to use a commercially available capacitor as the capacitor 18 shown in FIGS. 1, 2, 3, and 4C to 4K, but when not commercially available, it may be obtained by the method shown in FIG. 7.

Figure 5A:
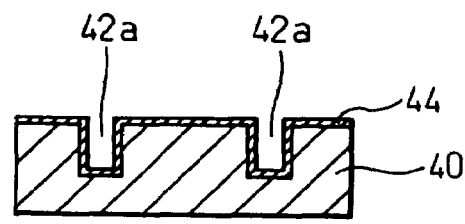
FIGS. 5A to 5G are sectional views for explaining steps of production of the capacitor shown in FIG. 2.

First, recesses 42a, 42a for forming vias opening at one surface of the silicon substrate 40 are formed, then the entire area of that surface of the silicon substrate 40 including the inside walls of the recesses 42a, 42a is formed with an oxide film 44 (FIG. 5A). The recesses 42a, 42a can be formed by laser or reactive ion etching (RIE).

Figure 5B:
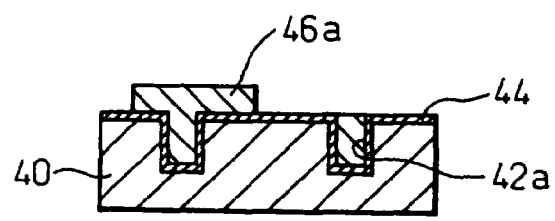

The entire surface of the oxide film 44 is formed with a thin film metal layer comprised of Ti—Cu by sputtering etc., then the thin film metal layer is used as a power feed layer for electroplating to fill the recesses 42a, 42a with copper or another metal and form a predetermined thickness of the metal layer on the thin film metal layer. Next, the formed metal layer is patterned by photolithography or another known method to form a conductor pattern 46a etc. (FIG. 5B).

Figure 5C:
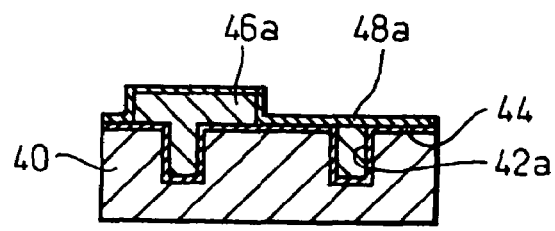

The entire area of one surface of the silicon substrate 40 formed with the conductor pattern 46a etc. is formed with a bonding layer comprised of Ti—Pt by sputtering etc., then is formed with a dielectric layer 48a of $SrTiO_3$, $BaTiO_3$, $Ta_2O_5$, etc. (FIG. 5C).

Figure 5D:
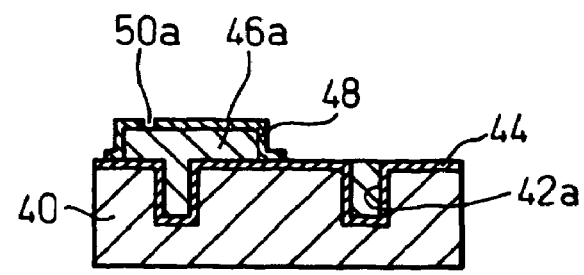

This dielectric layer 48a is patterned by photolithography or another known method to leave only the dielectric layer 48 covering the conductor pattern 46a and form a via hole 50a in the dielectric layer 48 (FIG. 5D).

Figure 5E:
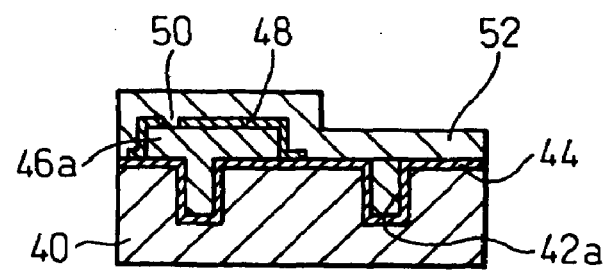

The entire area of one surface of the silicon substrate 40 formed with the dielectric layer 48 etc. is formed with a thin film metal layer comprised of Ti—Cu by sputtering etc., then the thin film metal layer is used as a power feed layer for electroplating to fill the via hole 50a with copper or another metal to form the via 50 and form a metal layer 52 comprised of copper etc. to a predetermined thickness (FIG. 5E).

Figure 5F:
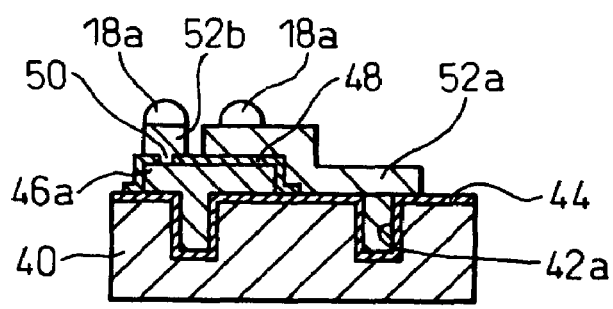

The metal layer 52 formed is patterned by photolithography or another known method to form a conductor pattern 52a and a conductor pattern 52b electrically connected to the conductor pattern 46a by the via 50 (FIG. 5F). The conductor patterns 52a, 52b are formed with solder bumps serving as external connection terminals 18a, 18a.

Figure 5G:
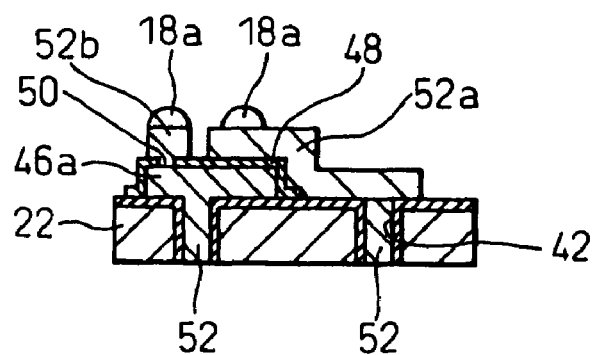

Next, the other surface of the silicon substrate 40 is polished to remove the bottoms of the recesses 42a, 42a and form the through holes 42. The end faces of the metal filled in the through holes 42 are exposed to form the vias 52, 52 (FIG. 5G).

The other surface of the silicon substrate 22 where the end faces of the vias 52, 52 are exposed, as shown in FIG. 2, is formed with a protective layer 17 of an epoxy, polyimide, etc. except at the exposed end faces of the vias 52, 52, then external connection terminals 18b, 18b with flat connection surfaces are formed by a similar method as with the conductor patterns 52a, 52b, and 46a, to thereby obtain the capacitor 18 shown in FIG. 2.

In the capacitor 18 shown in FIG. 2, the conductor circuit comprised of the conductor patterns 46a and 52b and the conductor circuit comprised of the conductor pattern 52a are formed with the conductor pattern 46a and the conductor pattern 52a adjoining each other via the dielectric layer 48 to exhibit the capacitor function.

In the semiconductor device 10 shown in FIG. 1, where the capacitor 18 shown in FIG. 2 obtained in this way is mounted, the external connection terminals 18a, 18a of the capacitor 18 and the electrode terminals 12a, 12a of the semiconductor chip 12 are electrically connected through capacitor connection pads 32c.

Figure 6:
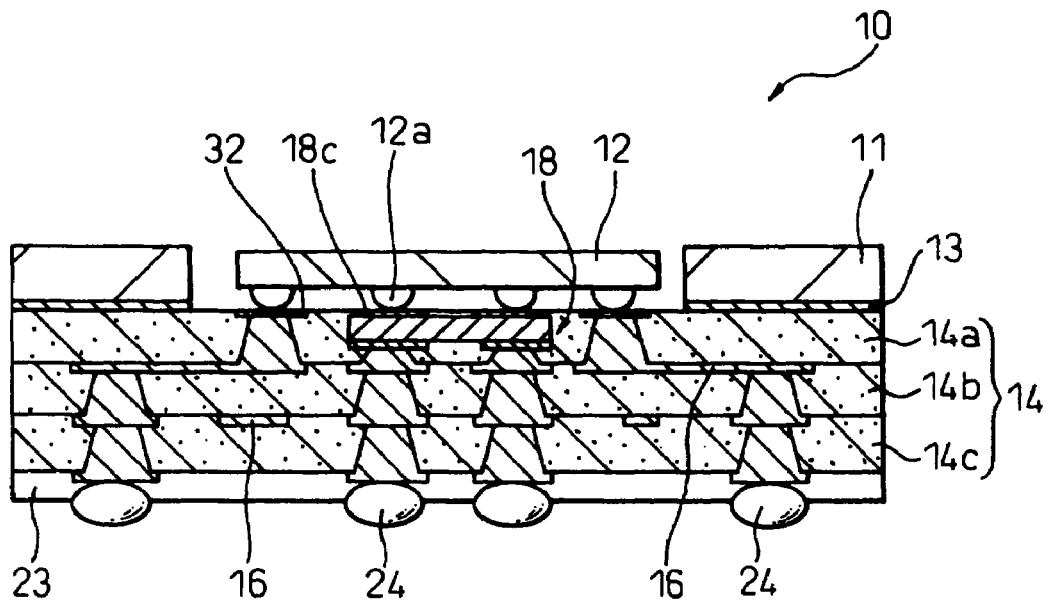
FIG. 6 is a sectional view for explaining another example of a semiconductor device according to the present invention.

In this respect, in the semiconductor device 10 shown in FIG. 6, the electrode terminals 12a, 12a of the semiconductor chip 12 are directly connected to the flat connection surfaces of the external connection terminals 18c, 18c formed on one surface of the capacitor 18. It is therefore possible to shorten the distance of the conductor circuit between the capacitor 18 and semiconductor chip 12 from the semiconductor device 10 shown in FIG. 1.

That is, the capacitor 18 using the semiconductor device 10 shown in FIG. 6, as shown in FIG. 7, has the connection surfaces of the external connection terminals 18b, 18c to be connected to the terminals of other electronic components formed flat. Therefore, in the package 14 with the capacitor 18, as shown in FIG. 8, the flat surfaces of the external connection terminals 18c, 18c are exposed at the semiconductor chip mounting surface and are directly connected to the corresponding electrode terminals 12a, 12a of the semiconductor chip 12.

Figure 8:
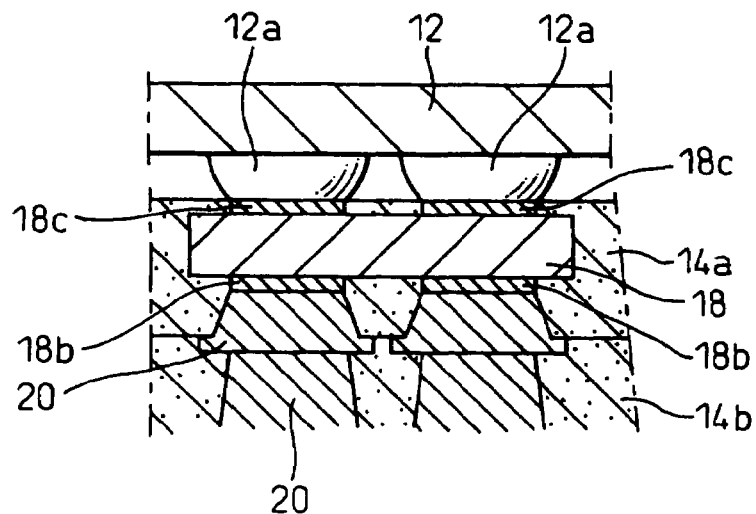
FIG. 8 is a partially enlarged sectional view of the semiconductor device shown in FIG. 6.

The external connection terminals 18b, 18b formed on the other surface of the capacitor 18 shown in FIG. 7, as shown in FIG. 6 and FIG. 8, are electrically connected with the solder balls 24, 24 serving as the board external connection terminals attached to the other surface of the package 14 by the conductor circuit formed by the stack of vias 20, 20 . . . formed in the layers.

Therefore, in the semiconductor device 10 shown in FIG. 6, the inductance of the conductor circuit can be further reduced by forming to the shortest distance the conductor circuit, formed by stacking of the vias 20, 20 . . . , electrically connecting the external connection terminals 18c, 18c of the capacitor to which the electrode terminals 12a, 12a of the semiconductor chip 12 are to be directly connected and the solder balls 24, 24 through the body of the capacitor 18.

Here, the "shortest distance" means the solder balls 24, 24 are formed in the direction of the verticals descending from the external connection terminals 18c, 18c to which the electrode terminals 12a, 12a of the semiconductor chip 12 are to be connected to the other surface of the package 14 and the conductor circuit connecting the external connection terminals 18c, 18c of the capacitor 18 and solder balls 24, 24 is formed substantially straight.

The capacitor 18 shown in FIG. 7 can be obtained by substantially the same steps as the steps for production of the capacitor 18 shown in FIGS. 5A to 5G except for the step of FIG. 5F.

At this step of FIG. 5F, photolithography or another known patterning method is applied to form a conductor pattern 52a and a conductor pattern 52b electrically connected to the conductor pattern 46a by vias 50. At this time, instead of the external connection terminals 18a, 18a (FIG. 2) comprised of the solder bumps, external connection terminals 18c, 18c provided with flat connection surfaces able to connect with the electrode terminals (solder bumps) 12a, 12a of the semiconductor chip 12 are formed at the conductor patterns 52a, 52b.

Figure 9A:
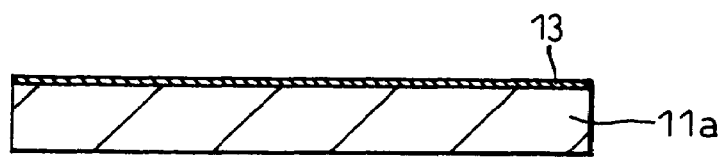
FIGS. 9A to 9C are sectional views for explaining steps of production of a semiconductor device package forming the semiconductor device shown in FIG. 8.
Figure 9B:
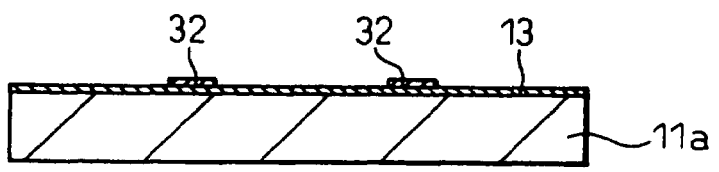
Figure 9C:
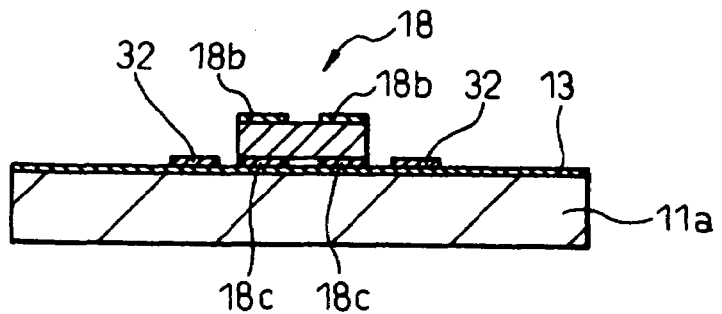

Even when forming the package 14 shown in FIG. 8 using the capacitor 18 shown in FIG. 7 obtained in this way, it is possible to obtain it by substantially the same steps as the steps of production shown in FIGS. 4A to 4K, but the steps of FIGS. 4A to 4C are changed to the steps shown in FIGS. 9A to 9C.

That is, one surface of the metal plate 11a comprised of copper or another metal is formed with a thin resin layer 13 comprised of a polyimide or other resin (FIG. 9A), then the surface of the thin resin layer 13 is formed with a thin film of copper or other metal by electroless plating. This is used as a power feed layer for electroplating to form a metal layer which is then patterned by photolithography or another known method to form connection pads 32, 32 . . . (FIG. 9B). In this step, as shown in FIG. 4B, the capacitor connection pads 32c, 32c are not formed. Therefore, the connection pads 32, 32 . . . formed are connected with vias 20 connected to conductor patterns etc. other than of the capacitor 18 forming the package 14.

Next, the capacitor 18 shown in FIG. 7 is mounted at the exposed portion of the thin resin layer 13 (FIG. 9C). At this time, the capacitor 18 is mounted so that the flat connection surfaces of the external connection terminals 18c, 18c of the capacitor 18 contact the exposed surface of the thin resin layer 13.

Next, the steps shown in FIGS. 4D to 4K are used to obtain the package 14 forming the semiconductor device shown in FIG. 6.

Above, the package 14 forming the semiconductor device 10 explained here was a three-layer circuit board, but it may also be made a more than three layer board or may be a single-layer package.

Further, the semiconductor device 10 is left with the frame-shaped metal plate 11 on the semiconductor chip mounting surface, but if the package 14 is sufficiently rigid, it is also possible to etch away all of the metal plate 11a. Further, solder balls 24 are attached as board external connection terminals, but it is also possible to use pins.

Summarizing the effect of the invention, according to the present invention, it is possible to shorten as much as possible the conductor circuit extending from the electrode terminals of the mounted semiconductor chip to the capacitor, so even if mounting a higher speed (higher frequency) semiconductor chip, it is possible to stabilize the power supplied to the semiconductor chip and possible to improve the reliability of the semiconductor device.

While the invention has been described with reference to specific embodiments chosen for purpose of illustration, it should be apparent that numerous modifications could be made thereto by those skilled in the art without departing from the basic concept and scope of the invention.

What is claimed is:

1. A method of production of a semiconductor device package, comprising a circuit board provided inside it with a capacitor, said method comprising:

forming connection pads on one surface of a metal plate, with one surface of the connection pads being in close contact with said one surface of the metal plate, directly connecting external connection terminals of a capacitor to the other surface of the connection pads, forming a circuit board provided with a conductor circuit electrically connecting said connection pads and said external connection terminals of the capacitor at said one surface of said metal plate, thereby embedding said capacitor in said circuit board, and etching the other surface of said metal plate to expose a semiconductor mounting surface of the circuit board, including at least said one surface of the connection pads to be directly connected to electrode terminals of a semiconductor chip.

2. A method of production of a semiconductor device package comprising a circuit board provided inside it with a capacitor said method comprising:

mounting said capacitor on one surface of a metal plate, with connection surfaces of external connection terminals provided on one surface of the capacitor being in close contact with said one surface of the said metal plate, forming a circuit board provided with a conductor circuit electrically connected with external connection terminals provided on the other surface of the capacitor at said one surface of said metal plate, thereby embedding said capacitor in said circuit board, and etching the other surface of said metal plate to expose a semiconductor mounting surface of the circuit board, including at least said connection surfaces of said external connection terminals provided on said one surface of the capacitor to which connection surfaces of the electrode terminals of a semiconductor chip are to be directly connected.

3. A method of production of a semiconductor device package as set forth in claim 1 or 2, further comprising using as said capacitor a two-sided wiring type capacitor comprised of a silicon substrate formed with external connection terminals on the two surfaces.

4. A method of production of a semiconductor device package as set forth in claim 1 or 2, further comprising making said circuit board conductor circuit electrically connecting the electrode terminals of the semiconductor chip mounted on the semiconductor chip mounting surface at one surface of the circuit board and the board external connection terminals formed on the other surfaces of said circuit board through the capacitor the shortest distance by forming the board external connection terminals in directions of verticals descending from the connection pads to which the electrode terminals of the semiconductor chip to be connected to said capacitor are directly connected to the other surface of the circuit board and by forming said conductor circuit substantially straight.

5. A method of production of a semiconductor device package as set forth in claim 2, further comprising making the conductor circuit electrically connecting the electrode terminals of the semiconductor chip mounted on the semiconductor chip mounting surface at one surface of the circuit board and the board external connection terminals formed on the other surface of said circuit board through the capacitor the shortest distance by forming the board external connection terminals in directions of verticals descending from the connection surfaces of the external connection terminals of the capacitor to which the electrode terminals of the semiconductor chip are directly connected to the other surface of the circuit board and by forming said conductor circuit substantially straight.

6. A method of production of a semiconductor device package as set forth in any one of claims 1 to 2, further comprising, when forming said circuit board as a multilayer circuit board, forming a conductor circuit electrically connecting the electrode terminals of said semiconductor chip to be mounted on the mounting surface of one surface of said multilayer circuit board and the external connection terminals formed at the other surface of said multilayer circuit board through the capacitor by stacking in straight lines the vias formed by filling metal into through holes passing through said circuit board multilayers.

7. A method of production of a semiconductor device package as set forth in any one of claims 1 to 2, further comprising using a frame-shaped metal plate obtained by etching away the portion covering the semiconductor chip mounting surface of the circuit board is used as a reinforcing member of said circuit board.

8. A method of production of a semiconductor device package for mounting a semiconductor chip thereto, comprising the steps of:

coating one surface of a metal plate with an insulation layer;

forming conductor patterns on the face of said insulation layer to form capacitor connection pads;

mounting a capacitor with external connection terminals on its top and bottom surfaces onto said capacitor connection pads;

forming a first lamination layer on said insulation layer to encapsulate said capacitor, said connection pads, and said capacitor external connection terminals, wherein said first lamination layer is formed with recesses, wherein at the bottom of said recesses, said capacitor external connection terminals and said capacitor connection pads are exposed; and forming a metal layer on said first lamination layer including filling said recesses with metal to form vias, forming connection pads from said formed metal layer on the surface of said first lamination layer wherein said semiconductor chip is mountable directly thereto including directly to said capacitor external connection terminals, and removing the metal plate to expose at least one connection pad.

9. The method of claim 8, also including the steps of forming a second lamination layer on said first lamination layer, wherein said second lamination layer is formed with recesses, wherein at the bottom of said recesses said first lamination layer connection pads are exposed;

forming a metal layer on said second lamination layer including filling said recesses with metal to form vias, wherein at least one of said second lamination layer vias is in alignment with at least one of said first lamination layer vias; and forming connection pads from said formed metal layer on the surface of said second lamination layer wherein said semiconductor chip is mountable directly thereto including to said capacitor external connection terminals.

10. The method of claim 9, also including the steps of forming a third lamination layer on said second lamination layer, wherein said third lamination layer is formed with recesses, wherein at the bottom of said recesses said second lamination layer connection pads are exposed;

forming a metal layer on said third lamination layer including filling said recesses with metal to form vias, wherein a plurality of said third lamination layer vies is in alignment with a respective plurality of said second lamination layer vias: and forming connection pads from said formed metal layer on the surface of said third lamination layer wherein said semiconductor chip is mountable directly thereto including to said capacitor external connection terminals.

\* \* \* \* \*